United States Patent
Chu et al.

(10) Patent No.: US 8,334,567 B2
(45) Date of Patent: Dec. 18, 2012

(54) LDMOS USING A COMBINATION OF ENHANCED DIELECTRIC STRESS LAYER AND DUMMY GATES

(75) Inventors: Sanford Chu, Singapore (SG); Yisuo Li, Singapore (SG); Guowei Zhang, Singapore (SG); Purakh Raj Verma, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 12/916,653

(22) Filed: Nov. 1, 2010

(65) Prior Publication Data

US 2011/0042743 A1    Feb. 24, 2011

Related U.S. Application Data

(62) Division of application No. 11/488,117, filed on Jul. 17, 2006, now Pat. No. 7,824,968.

(51) Int. Cl.
*H01L 29/76* (2006.01)

(52) U.S. Cl. ........ 257/335; 257/336; 257/340; 257/344; 257/E29.256

(58) Field of Classification Search .................. 257/336, 257/340, 343, 344, E29.256, 335
See application file for complete search history.

(56) References Cited

U.S. PATENT DOCUMENTS

| | | | |
|---|---|---|---|
| 5,252,848 A * | 10/1993 | Adler et al. | 257/328 |
| 6,362,508 B1 * | 3/2002 | Rasovsky et al. | 257/369 |
| 6,518,138 B2 | 2/2003 | Hsing | |
| 6,828,628 B2 | 12/2004 | Hergenrother et al. | |
| 6,927,453 B2 * | 8/2005 | Shibib et al. | 257/336 |
| 7,151,296 B2 * | 12/2006 | Wu et al. | 257/328 |
| 7,309,637 B2 | 12/2007 | Lee et al. | |
| 7,508,038 B1 * | 3/2009 | Ransom et al. | 257/360 |
| 2002/0142606 A1 * | 10/2002 | Yoon | 438/694 |
| 2005/0026332 A1 | 2/2005 | Fratti et al. | |
| 2005/0221566 A1 | 10/2005 | Curello et al. | |
| 2005/0266632 A1 | 12/2005 | Chen et al. | |
| 2005/0285137 A1 * | 12/2005 | Satoh | 257/178 |
| 2006/0009041 A1 | 1/2006 | Iyer et al. | |
| 2006/0091490 A1 | 5/2006 | Chen et al. | |
| 2006/0281240 A1 * | 12/2006 | Grudowski et al. | 438/199 |

OTHER PUBLICATIONS

G. Ma, et al. "High Frequency Power LDMOS Technologies for Base Station Applications Status, Potentilas, and Benchmarking," IEDM Tech. Dig., pp. 373-375, 2005.

M. Kondo, et al. "High Performance RF Power LDMOSFETs for Cellular Handsets Formed in Thick-Strained-Si/Relaxed-SiGe Structure," IEDM Tech. Dig., pp. 377-379, 2005.

"Mobility Enhancement: The Next Vector to Extend Moore's Law," pp. 18-23, IEEE Circuits & Device Magazine, Sep./Oct. 2005.

* cited by examiner

*Primary Examiner* — Michael Trinh
(74) *Attorney, Agent, or Firm* — Horizon IP Pte Ltd

(57) ABSTRACT

First example embodiments comprise forming a stress layer over a MOS transistor (such as a LDMOS Tx) comprised of a channel and first, second and third junction regions. The stress layer creates a stress in the channel and the second junction region of the Tx. Second example embodiments comprise forming a MOS FET and at least a dummy gate over a substrate. The MOS is comprised of a gate, channel, source, drain and offset drain. At least one dummy gate is over the offset drain. A stress layer is formed over the MOS and the dummy gate. The stress layer and the dummy gate improve the stress in the channel and offset drain region.

20 Claims, 10 Drawing Sheets

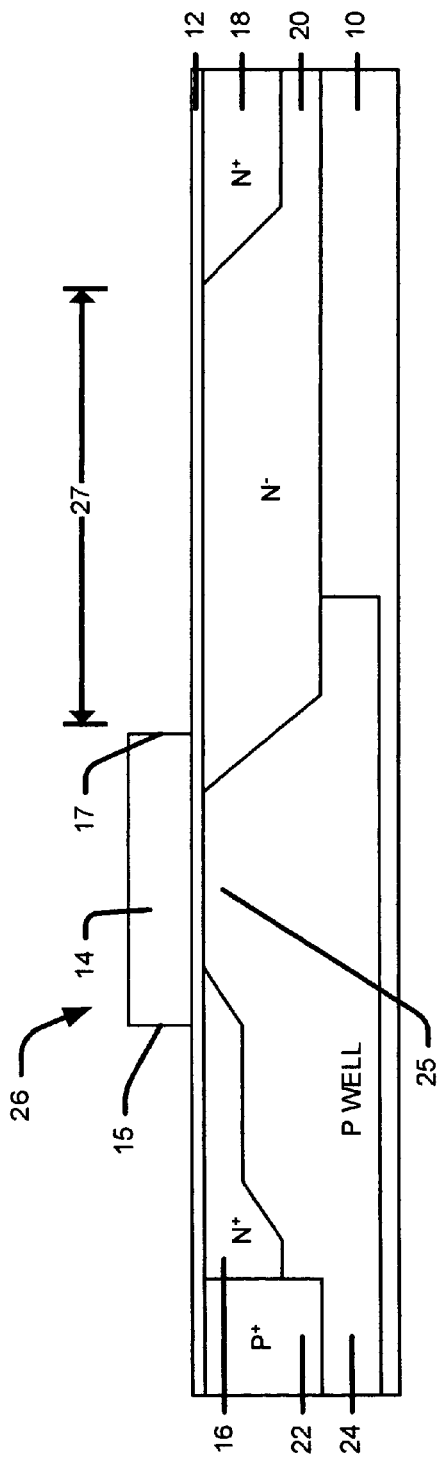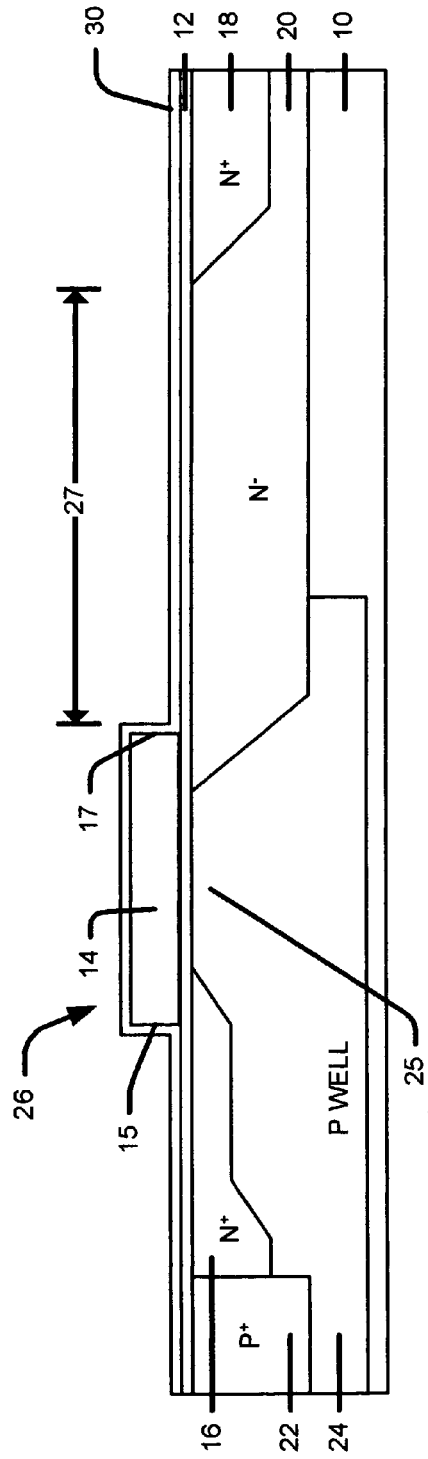

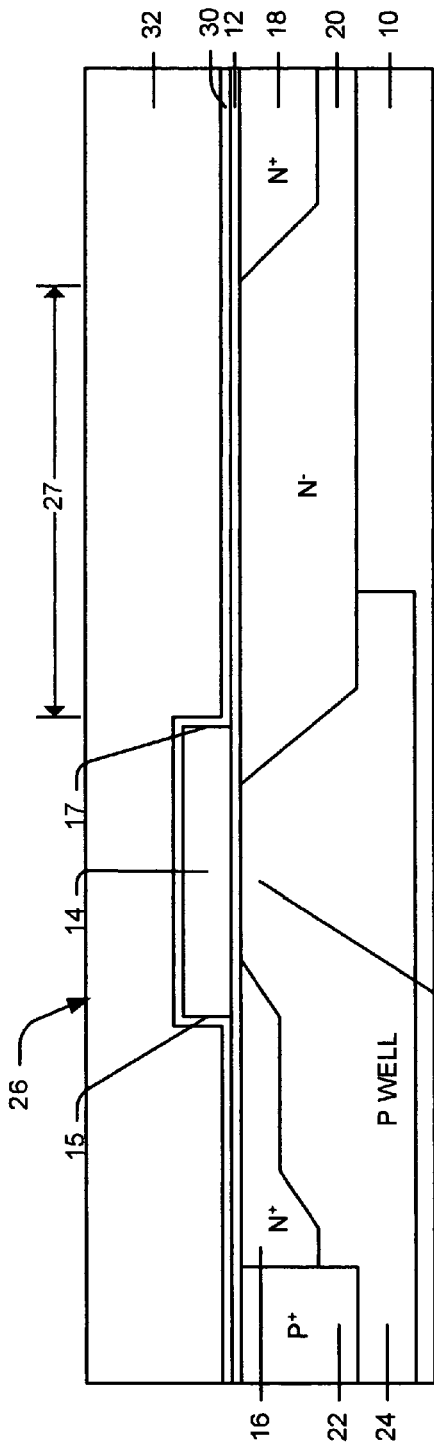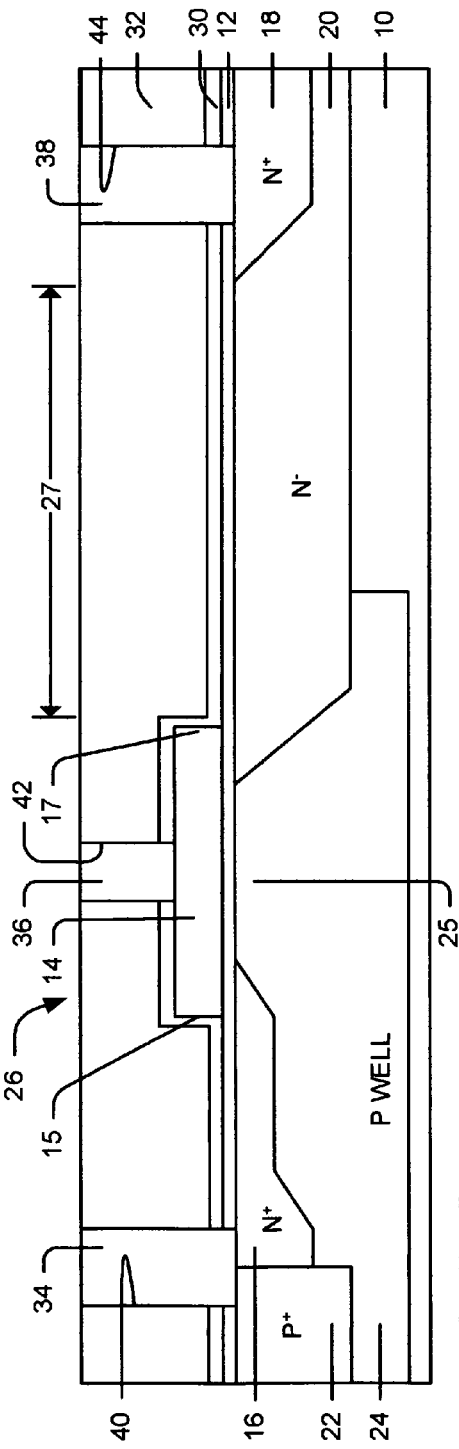

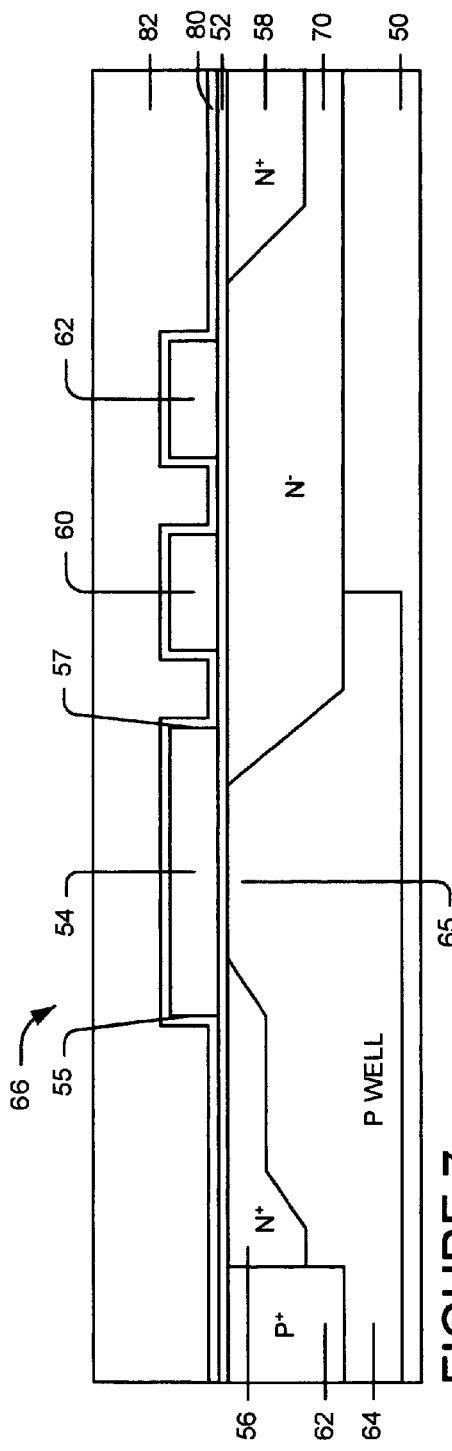
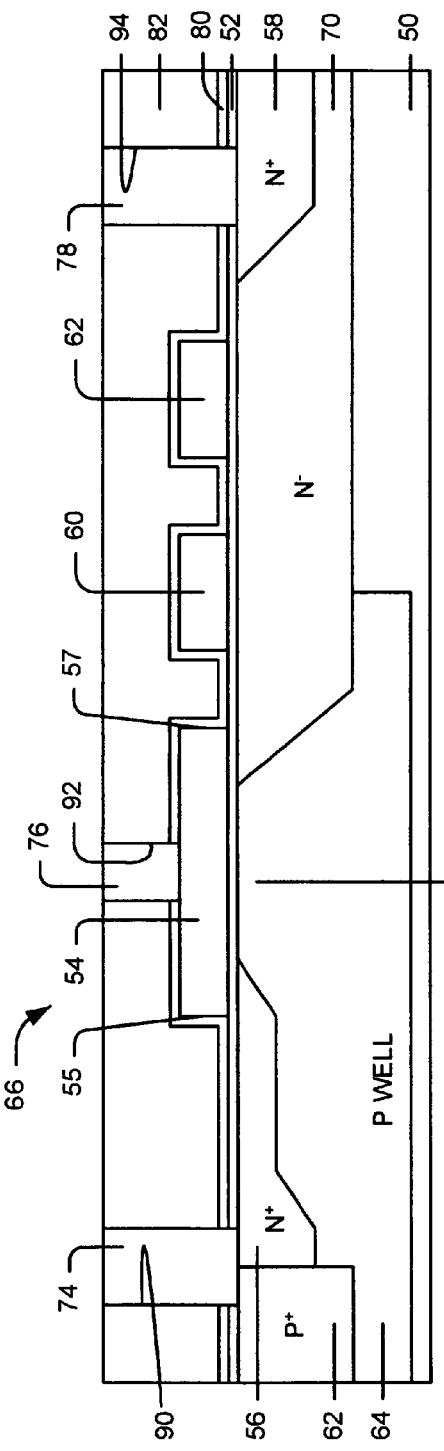

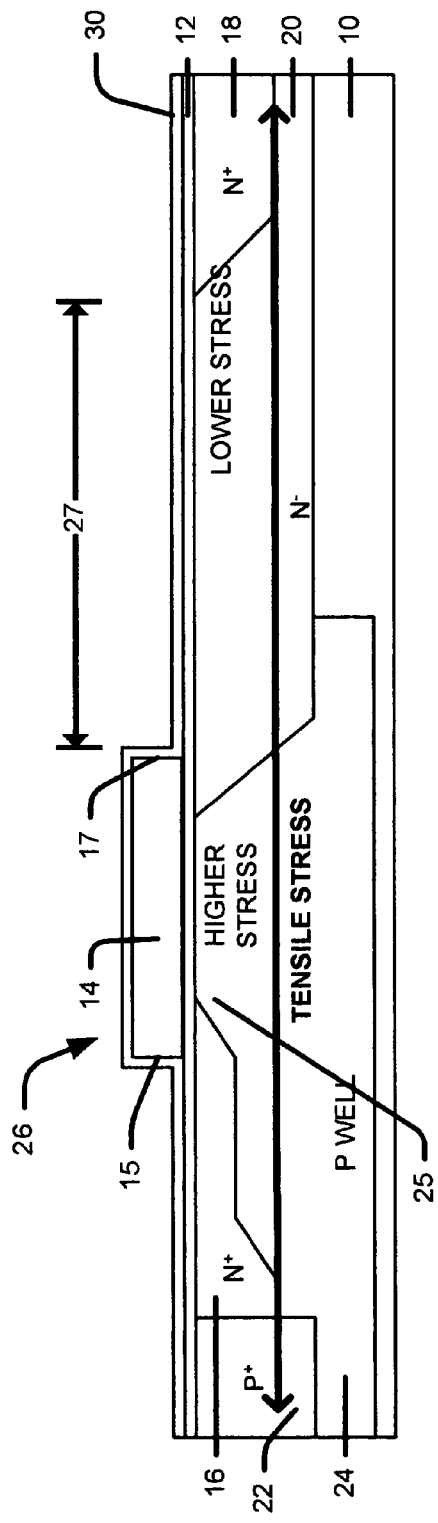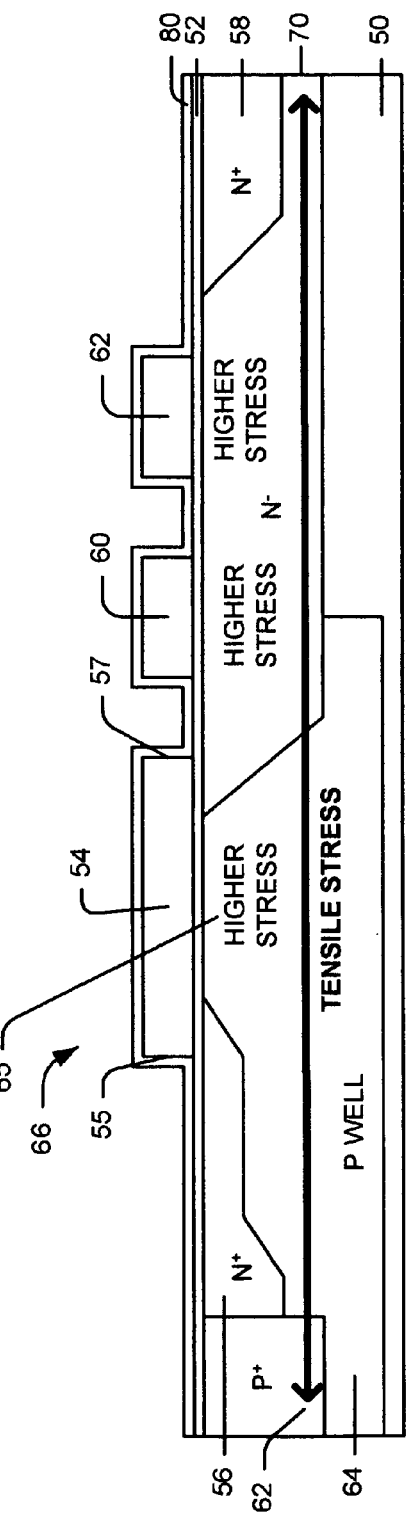
FIGURE 10D
FIGURE 10E

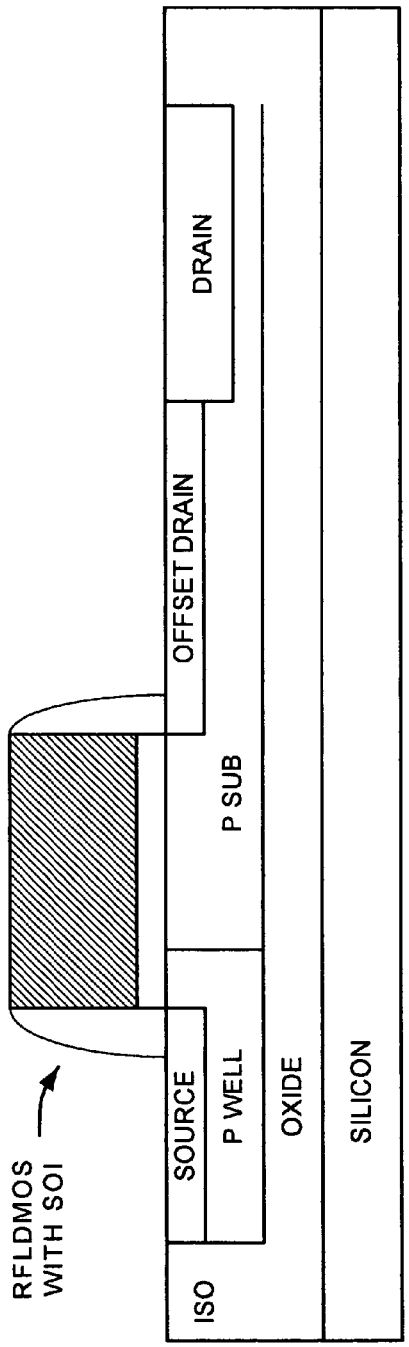
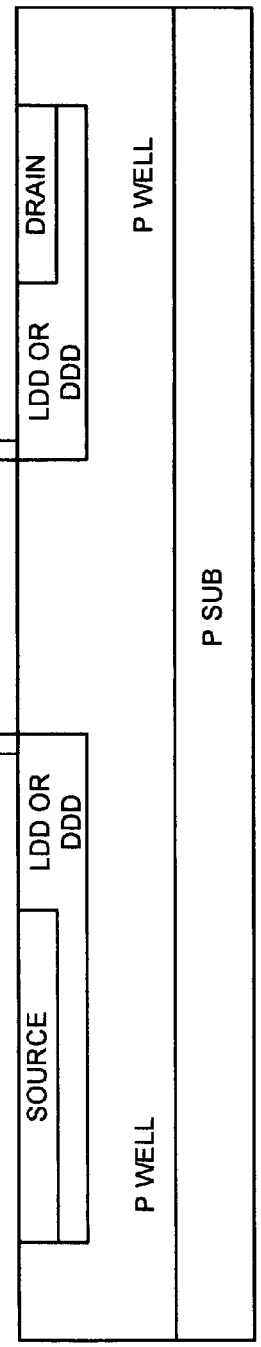
FIGURE 11A
FIGURE 11B

HV PFET WITH DDD

HV NFET WITH DDD ON SOI

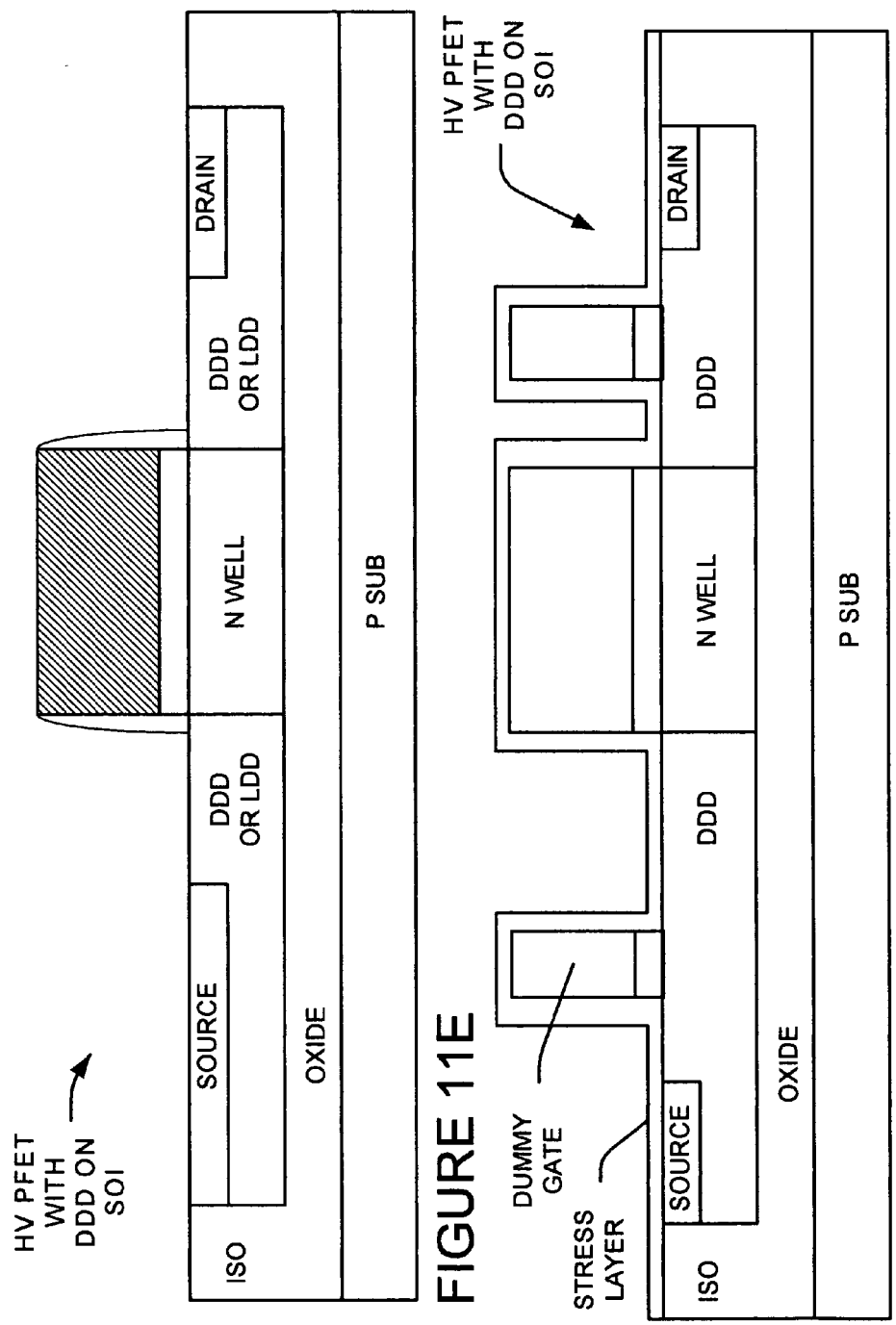

LDMOS USING A COMBINATION OF ENHANCED DIELECTRIC STRESS LAYER AND DUMMY GATES

CROSS-REFERENCE TO RELATED APPLICATION

This application is a divisional application which claims benefit of U.S. patent application Ser. No. 11/488,117, filed on Jul. 17, 2006, U.S. Pat. No. 7,824,968.

BACKGROUND OF INVENTION

1) Field of the Invention

This invention relates generally to fabrication of semiconductor devices and more particularly to a lateral double diffused metal-oxide-semiconductor (LDMOS) and the fabrication of same.

2) Description of the Prior Art

Today's integrated circuits can include a huge number of transistors, capacitors, or other semiconductor devices formed in a semiconductor. Smaller devices are the key to enhance performance and to increase reliability in devices. As devices are scaled down, however, the technology becomes more complex and new methods are needed to maintain the expected performance enhancement from one generation of devices to the next. This relates mainly toward the primary semiconducting material of microelectronics, namely Silicon (Si), or more broadly, to Si based materials. One of the most important indicators of device performance is the carrier mobility. There is great difficulty in keeping carrier mobility high in devices of the deep submicron generations. A promising avenue toward better carrier mobility is to modify slightly the semiconductor that serves as raw material for device fabrication. It has been known, and recently further studied that Si, strained in tension, has intriguing carrier properties. Mechanical stress in the channel region markedly influences the performance and reliability of MOS devices.

It has been known that a nitride etch stop film causes tensile stress in the Si substrate. Thus, there has been a lot of interest in high-stress nitride etch stop film in the fabrication of MOS devices.

Tensile stress may be obtained by forming a nitride etch stop to create stress (that translates to strain in the underlying silicon) in the channel of a MOS device. Device mobility has been extensively studied by introducing strain in the channel. One such technique is the use of contact etch stop nitride layer as a stressor. To achieve increased drive current via increased carrier mobility and velocity, thicker nitride layers may be used to meet higher, specified stress levels. The current methods of producing semiconductor device can be further improved upon.

The importance of overcoming the various deficiencies noted above is evidenced by the extensive technological development directed to the subject, as documented by the relevant patent and technical literature. The closest and apparently more relevant technical developments in the patent literature can be gleaned by considering the following.

US 2006/0009041A1 to Iyer, R. S. is entitled Silicon Nitride Film With Stress Control.

US 2005/0266632A1 to Chen, Yun-Hsiu is entitled Integrated Circuit With Strained And Non-Strained Transistors, And Method Of Forming Thereof.

U.S. Pat. No. 6,828,628 to Hergenrother, John Michael is entitled Diffused MOS Devices With Strained Silicon Portions And Methods For Forming Same.

US 2005/0026332A1 to Fratti, Roger is entitled Techniques For Curvature Control In Power Transistor Devices.

US 2005/0221566A1 to Curello, Giuseppe is entitled Enhancing Strained Device Performance By Use Of Multi Narrow Section Layout.

The article entitled "High Frequency Power LDMOS Technologies For Base Station Applications Status, Potentials, And Benchmarking," to G. Ma, et. al., IEDM Tech. Dig., pp 373-375, 2005.

The article entitled "High Performance RF Power LDMOSFET's For Cellular Handsets Formed In Thick-Strained-Si/Relaxed-SiGe Structure," to M. Kondo, et. al. IEDM Tech. Dig., pp 377-379, 2005.

The article entitled "Mobility Enhancement: The Next Vector To Extend Moore's Law," IEEE Circuits & Device Magazine, pp. 18-23, September/October 2005.

SUMMARY OF THE INVENTION

Some of the example embodiments of the present invention provide a structure and a method of manufacturing a lateral double diffused metal-oxide-semiconductor (LDMOS) using a stress layer which is characterized as follows. A example method of forming a transistor comprises the following steps. A gate is formed over a substrate and a channel is formed under the gate. A first junction region having a first dopant concentration is formed proximate one side of the gate. A second junction region having a second dopant concentration is formed adjacent the opposing side of the gate. A third junction region is formed having a third dopant concentration is formed adjacent the second junction region and spaced apart from the opposing side of the gate. The second dopant concentration is less than the first dopant concentration and is less than the third dopant concentration. A stress layer is formed over the substrate and over the gate. The stress layer creates a stress in the channel and in the second junction region. In an aspect, the semiconductor transistor is a LDMOS, P LDMOS, N LDMOS, RF LDMOS, HV FET, HV FET SOI, high voltage field effect transistor, or a field effect transistor having an offset source and/or offset drain.

In another aspect the method further comprises the step of forming at least one dummy gate over the second junction region, the stress layer also is formed over the at least one dummy gate.

Another example embodiment is a semiconductor device comprising:
a substrate;
a gate over the substrate, the gate has first and second sides;
a source in the substrate proximate the first side of the gate; the source having a first dopant concentration;
an offset drain in the substrate adjacent the second side of the gate; the offset drain having a second dopant concentration;
a drain in the substrate adjacent the offset drain; the drain having a third dopant concentration; the second dopant concentration of the offset drain is less than the first and third dopant concentration of the source and drain regions; and
a stress layer over the substrate and over the gate, the stress layer creates a stress in the channel and in the offset drain.

An aspect further comprises at least one dummy gate over the substrate within the offset drain region; the stress layer also is over the at least one dummy gate.

Other embodiments comprise structures of the example embodiments.

The example embodiments are defined by the specification and finally issued claims.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 through 4 are cross sectional views for illustrating a method for fabricating a MOS Tx according to an first exemplary embodiment of the present invention.

FIGS. 5 through 8 are cross sectional views for illustrating a method for fabricating a MOS Tx according to an second exemplary embodiment of the present invention.

FIG. 10D is a cross sectional view of an LDMOS device in accordance with the first embodiment of the present invention illustrating the relative stresses within the wafer without the use of dummy gates.

FIG. 10E is a cross sectional view of an LDMOS device in accordance with the first embodiment of the present invention illustrating the relative stresses within the wafer with the use of dummy gates.

FIGS. 11A to 11E are schematic cross sectional views illustrating other exemplary structures with which the teachings of the present invention may be used.

FIG. 11F shows an example, where dummy gates and a stress layer are formed over the LDD or DDD Source (offset source or LLD Source) and DDD drain.

DETAILED DESCRIPTION OF THE EXAMPLE EMBODIMENTS

Figure 5:
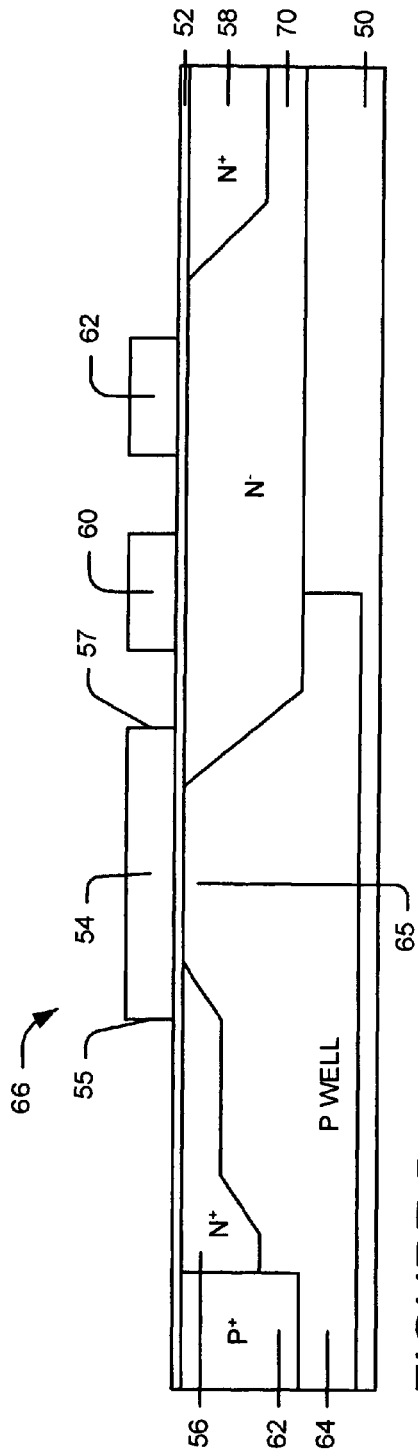

The example embodiments of the present invention will be described in detail with reference to the accompanying drawings. The example embodiments provide an improved MOS transistor and a method of fabricating the same.

Below are exemplary descriptions using N-LDMOS devices employing tensile stress layers. However, it is noted that the exemplary embodiments are equally applicable to P-LDMOS devices (or other type device) employing compressive stress layers. The example embodiments are applicable at least to MOS transistors (Tx)/field effect transistors (FET) having offset drains (e.g., drain extensions, deeply doped drains, doubly doped drains) or the like.

Defined Terms

A tensile stress layer exerts a tensile stress into the underlying layer. A tensile stress layer therefore has an inherent (internal) compressive stress.

A compressive stress layer exerts a compressive stress into the underlying layer. A compressive stress layer therefore has an inherent (internal) tensile stress.

I. First Example Embodiment

FIGS. 1 to 4 illustrate a first exemplary embodiment of the present invention wherein a stress layer is formed over the substrate and gate of an LDMOS. The stress layer that exerts stress into the channel under a (lateral double diffused metal-oxide-semiconductor) LDMOS gate. The resulting structure is illustrated in FIG. 4.

A N-type LDMOS (N LDMOS) is illustrated but the embodiment is not limited to n-type or LDMOS devices.

FIG. 1, in an exemplary embodiment of the present invention, an LDMOS 26 includes substrate 10 having dielectric layer 12 formed thereover to a thickness of, for example, from about 10 to 2000 angstroms. Substrate 10 may be comprised of, for example, silicon (Si), SiGe, or SiC and preferably silicon. The substrate can be a silicon on insulator (SOI) substrate.

Gate dielectric layer 12 may be comprised of, for example, silicon oxide, silicon oxynitride (SiON), $HfO_2$ or $ZrO_2$ and preferably silicon oxide.

Gate 14 is formed over the gate dielectric layer 12 to a thickness of from about, for example, 500 to 5000 angstroms and preferably about 2000 angstroms. Gate 14 includes exposed sidewalls 15, 17 and may be comprised of, for example, polysilicon, polysilicon germanium, cobalt silicide ($CoSi_2$) or nickel silicide (NiSi) and preferably polysilicon. Channel 25 is beneath gate 14.

First junction region 16 may be a source region and is formed within substrate 10 proximate to or close to gate 14. The first junction region may be adjacent to gate 14 as shown in FIG. 1 or spaced from the gate. Proximate means close to, Proximate can mean adjacent to or spaced from. The first junction region 16 can be spaced apart from the gate as illustrated for example in FIG. 11B.

The first junction region 16 can be formed to a depth of, for example, from about 50 to 10,000 angstroms. For an N-LDMOS 26, source 16 is comprised of N type ions. The source region 16 can have a dopant concentration between 5E19 and 2E21 atoms/cc.

Second junction region 20 may be an offset drain (low doped drain (LDD)) and is formed within substrate 10 adjacent to gate 14 on the opposite side from source 16 to a depth of, for example, from about 100 to 50,000 angstroms and preferably from about 4000 to 10,000 angstroms. Offset drain 20 is an $N^-$ offset drain. The off set drain 20 has a lower concentration than the source 16 and drain regions 18. The offset drain 20 can have a concentration between about 1 to 3 orders of magnitude lower than the source or drain regions. The offset drain (e.g., LDD or DDD drain) 20 can have a dopant concentration between 1E16 and 1E18 atoms/cc.

The drift region 27 is comprised of the offset drain 20 between the channel region 25 and the drain region 18. The drift region may have a length between about, for example, 200 and 10,000 nm.

The length of drift region (Lod) 27 may be, for example, between about 1 to 20 times as long as the length of channel width 25 (Lg) and preferably from about 3 to 8.

Third junction region 18 may be a drain region and is formed within substrate 10 adjacent and outboard offset drain 20 to a depth of, for example, from about 50 to 5000 angstroms. Drain 18 is an $N^+$ drain. The drain can have a dopant concentration between 5E19 and 2E21 atoms/cc. The third junction 18 can be spaced apart from the gate 17.

The first, second and third junction regions 16, 20, 18 each may each be doped with a first conductivity type dopant. The second junction region 20 (offset drain or lightly doped drain) has a lower dopant concentration then either of the first or section junction regions 16, 18 (source, drain, respectively).

P-well pick-up or body sinker 22 ($P^+$ region) may be formed adjacent and outboard of the source 16 to a depth of, for example, from about 50 to 5000 angstroms.

P-well 24 is formed within substrate 10 below gate 14, source 16, P-well pick-up 22 and at least a portion of offset drain 20 to a depth of, for example, from about 200 to 1E5 angstroms.

P-well pick-up 22 and P-well 24 have the opposite conductivity type dopant as the first, second and third junction regions 16, 20, 18.

Figure 10A:
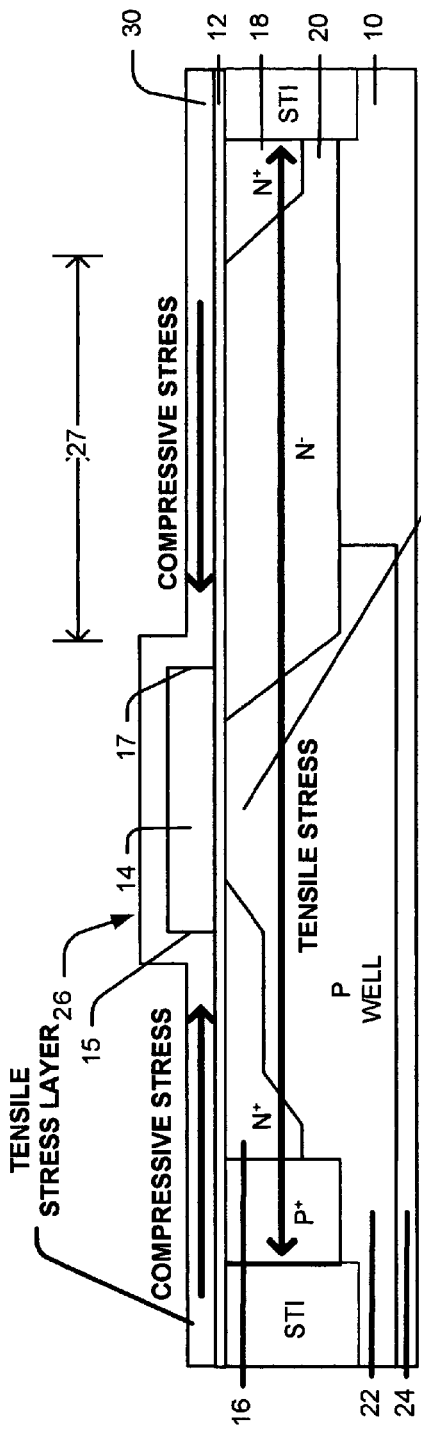
FIG. 10A is a cross sectional view of an LDMOS device in accordance with the first embodiment of the present invention illustrating the stresses.

Isolation regions may be formed outside of the P-well pick-up 22 and drain 18 (see FIG. 10A, for example).

The above elements can be formed in any order using any steps as known by those skilled in the art.

In FIG. 2, an exemplary embodiment of the present invention, a stress layer 30 having a stress is formed over dielectric layer 12, gate 14 and exposed gate sidewalls 15, 17 to a thickness of, for example, from about 20 to 5000 angstroms and preferably from about 200 to 600 angstroms. The stress layer may exert a stress in the underlying layer, for example, between about 1 Mpa and 3 Gpa.

Stress layer 30 may have an tensile stress or an compressive stress. For a N-LDMOS device, the stress layer preferably has a tensile stress, that is, causes tensile stress in the underlying substrate (see FIGS. 10A and 10B for example) which will be used hereafter for purposes of example.

Tensile stress layer 30 may be comprised of, for example, nitride, silicon nitride ($Si_3N_4$) or a silicon nitride/silicon oxynitride stack ($Si_3N_4$/SiON). Stress layer 30 may have a thickness of, for example, from about 450 to 550 angstroms and preferably about 500 angstroms.

Tensile stress layer 30 may place a uniaxial or biaxial tensile stress across the channel 25 and offset drain 20 or, for example, between about 1 Mpa and 3 Gpa. When the channel width is very long, the tensile stress can be treated as uniaxial, whereas when the channel width is comparable with the channel width, the stress could be treated as biaxial.

For example, for a tensile stress layer 30 having an inherent compressive stress with a thickness of, for example, between about 450 and 550 angstroms and preferably about 500 angstroms. The tensile stress layer may produce from about, for example, 1.8 to 6.6 Mpa, and preferably from about 2.0 to 6.0 Mpa, tensile stress in the underlying substrate including the channel 25 (or drift region).

A tensile stress layer 30 may place a tensile stress on the offset drain (drift region 27) of, for example, between about 2.0 Mps and 3.0 Gpa.

In FIG. 3, an exemplary embodiment of the present invention, an inter-layer dielectric (ILD) layer 32 is formed over stress layer 30. ILD layer 32 may have a thickness of, for example, from about 0.05 to 3 μm. ILD layer 32 may be comprised of, for example, oxide or oxide formed using tetraethyl orthosilicate (TEOS) and preferably oxide.

It is noted that alternative stress engineering methods, such as, for example, Stress Memorization Technology (SMT), may be used as a way to create tensile stress in the channel and LDD regions with equal effectiveness. For example, the stress can be memorized in the channel even when we remove the layer 30 before the ILD layer 32 with the technology SMT.

In FIG. 4, an exemplary embodiment of the present invention, ILD layer 32 and stress layer 30 are patterned to form: (1) first opening 40 exposing at least a portion of substrate 10 within a least a portion of first junction region 16; (2) second opening 42 exposing at least a portion of gate 14; and (3) third opening 44 exposing a portion of substrate 10 within third junction region 18. The ILD layer 32 and stress layer 30 may be patterned by, for example, photomasking and reactive ion etch (RIE) processes. Respective contact structures 34, 36, 38 may then be formed within openings 40, 42, 44. Contact structures 34, 36, 38 may be comprised of tungsten (W) or titanium nitride (TiN).

In one option, stress layer 30 is removed before the ILD layer 32 is formed (for example, see the SMT discussion above).

The inventors have discovered that the use of overlying stress layer 30 improves the performance of LDMOS 26, that is, for example, the Ron is decreased, the gm is increased and the Idsat is increased.

II. Second Example Embodiment—Dummy Gates and Stress Layer

FIGS. 5 to 8 illustrate a second exemplary embodiment of the present invention wherein one or more dummy gate structures are also formed over the substrate at least within the second junction region (offset drain). A stress layer is formed over the dummy gates and substrate and gate and of the LDMOS. The stress layer has an inherent stress that exerts stress into the channel under a LDMOS gate. The resulting structure is illustrated in FIG. 8.

FIG. 5, in an exemplary embodiment of the present invention, an LDMOS 66 includes substrate 50 having gate dielectric layer 52 formed thereover to a thickness of, for example, from about 10 to 2000 angstroms. Substrate 50 may be comprised of, for example, silicon (Si), silicon germanium (SiGe) or silicon carbide (SiC) and preferably silicon.

Gate dielectric layer 52 may be comprised of, for example, silicon oxide, silicon oxynitride (SiON), $HfO_2$ or $ZrO_2$ and preferably silicon oxide. First junction region 56 may be a source region and is formed within substrate 50 proximate to gate 54 (and may be adjacent to gate 54 as shown in FIG. 5) to a depth of, for example, from about 50 to 10,000 angstroms. For an N-LDMOS 66, source 56 is comprised of N type ions. The source region 56 can have a dopant concentration between 5E19 and 2E21 atoms/cc.

Second junction region 70 may be an offset drain (low doped drain (LDD)) and is formed within substrate 50 adjacent to gate 54 on the opposite side from source 56 to a depth of, for example, from about 100 to 50,000 angstroms. Offset drain 70 is an $N^-$ offset drain. The offset drain 70 can have a dopant concentration between 1E16 and 1E18 atoms/cc.

Third junction region 58 may be a drain region and is formed within substrate 50 adjacent and outboard offset drain 70 to a depth of, for example, from about 50 to 5000 angstroms. Drain 58 is an N+ drain.

P-well pick-up or body sinker 62 (P+ region) can be formed adjacent and outboard source 56 to a depth of, for example, from about 50 to 5000 angstroms.

P-well 64 is formed within substrate 50 below gate 54, source 56, P-well pick-up 62 and at least a portion of offset drain 70 to a depth of, for example, from about 200 to 1E5 angstroms.

The doped regions can have the same concentration range as described above in the first embodiment.

A. Form Gate and Dummy Gates

Referring to FIG. 5, in an exemplary embodiment of the present invention, gate 54 and dummy gates structures 60, 62 are formed. A conductive layer can be formed over the dielectric layer and patterned to form gate 54 and dummy gates structures 60, 62. Alternately, the gate and dummy gates can be formed from different layers.

Gate 54 may be formed over dielectric layer 52 to a thickness of, for example, from about 500 to 5000 angstroms. Gate 54 includes exposed sidewalls 55, 57. The gate may be comprised of, for example, polysilicon, polysilicon germanium, cobalt silicide ($CoSi_2$) or nickel silicide (NiSi) and preferably polysilicon. Channel 25 is beneath gate 14.

At least one dummy gate, or, for example, as shown in FIG. 5, two dummy gates 60, 62 are also formed over dielectric layer 12 when gate 54 is formed and may have the same thickness and be comprised of the same material or same layer as gate 54. The dummy gates can be formed in the same step as the gates.

Figure 6:
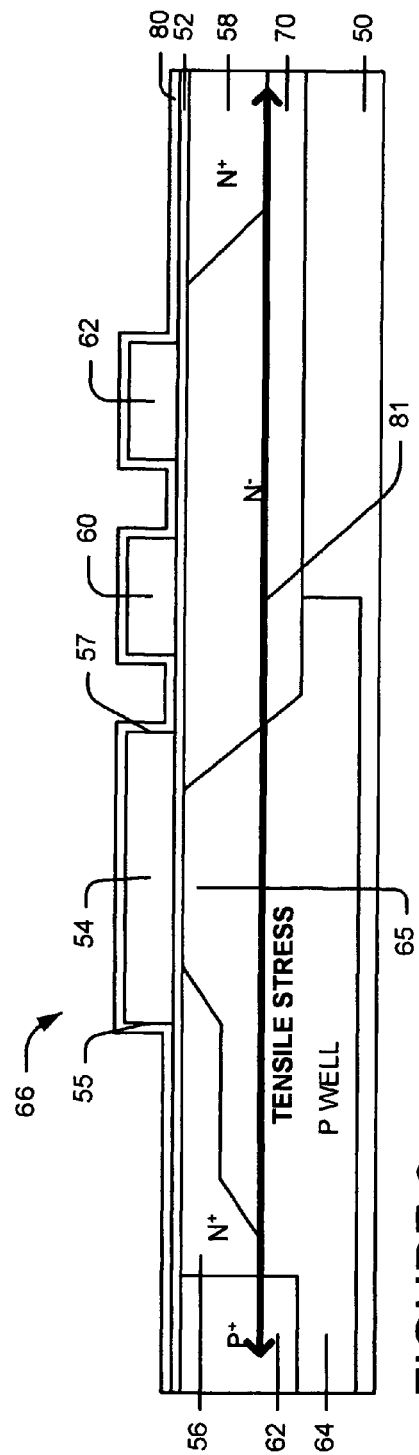

In FIG. 6, an exemplary embodiment of the present invention, a stress layer 80 having an inherent stress is formed over dielectric layer 52, gate 54, exposed gate sidewalls 55, 57 and dummy gates 60, 62 (and their respective exposed sidewalls) to a thickness of, for example, from about 20 to 5000 angstroms and preferably from about 200 to 600 angstroms. Note that usually isolation regions (e.g., STI) are formed on the ends of the regions 58 and 62 (see FIG. 10A, for example).

Stress layer 80 may have an inherent compressive stress or an inherent tensile stress. For N-LDMOS device, the stress layer is preferably a tensile stress layer. Stress layer 80 may be comprised of, for example, nitride, silicon nitride ($Si_3N_4$) or a silicon nitride/silicon oxynitride stack ($Si_3N_4$/SiON), and is preferably SiN.

FIG. 6 shows an example of the tensile stress 81 (arrow) in the substrate from a tensile stress layer 80.

Stress layer 80 may have a thickness of, for example, from about 450 to 550 angstroms and preferably about 500 angstroms.

For example, a tensile stress layer 80 that has an inherent compressive stress may produce a tensile stress in channel 65 from about, for example, 1.8 to 6.6 Mpa, and preferably from about 2.0 to 6.0 Mpa.

The stress ranges in the offset drain region 70 may have a tensile stress of, for example, between about 3.0 Mps and 3.0 Gpa.

TABLE 1

(comparison of stress in $1^{st}$ and $2^{nd}$ embodiments)

|  | $1^{st}$ embodiment | $2^{nd}$ embodiment-dummy gates |
|---|---|---|
| Stress in offset drain region | From 1.0 MPS to 3.0 GPA | From 2.0 MPS to 3.0 GPA |

In the $2^{nd}$ embodiment with dummy gates 60, 62, the tensile stress may be increased in the offset drain region 70 from about, for example, 1 to 100%.

The inventors have discovered that the use of dummy gate (s) 60, 62 assists in the distribution of the stress from stress layer 80 over the entire offset drain 70 and drain region 58.

Dummy gates under the SiN stress layer put a tensile stress on the offset drain region.

A tensile stress is in offset drain directly under each dummy gate and a tensile stress is in the offset drain under the SiN stress layer adjacent to the gate. See FIGS. 10A and 10B, for example.

The tensile stress improves the mobility in the offset drain region, which decreases the Ron so that the dummy gates improve the stress distribution over the second junction region/low doped drain region/offset drain 70, improving the performance of the LDMOS.

Dummy Gates Create Stress/Strain in Substrate to Improve Device

Dummy gate(s) 60, (62) increases the stress at offset drain region 70 especially near the surface, but it does not increase the stress in channel 65. Dummy gate(s) 60, (62) enhances the tensile stress at offset drain region 70, but it should not appreciably affect the stress under channel 65. The stress inside channel 65 brings about the improvement of channel mobility for Idsat. With the help from dummy gate 60, (62), the stress on the offset drain region is improved, which leads to an increase in offset drain region's mobility so the Ron is decreased. Accordingly with stress layer 80 and dummy gate 60, (62) the Idsat and Ron are both improved.

The stress is increased at the offset drain part due to the dummy gate stack 60, (62). The gate stack 60, (62) increases the stress beneath the stack 60, (62) as in like normal MOSFET stress engineering. Beneath the dummy gate stack 60, (62), it is the offset drain area. So the stress increases at the offset drain area due to the dummy gate stack.

The following parameters influence device performance. The density of the dummy gates, the width of a single dummy gate, the spacing between adjacent dummy gates, the spacing between the dummy gate to the original LDMOS gate and the spacing between the dummy gate to the drain are factors to consider in the instant invention. It is noted that the height of the dummy gate will be the same as the height for original gate as they are patterned together.

In FIG. 7, in an exemplary embodiment of the present invention, an inter-layer dielectric (ILD) layer 82 is formed over stress layer 80. ILD layer 82 may have a thickness of, for example, from about 0.05 to 3.0 μm. and preferably from about 1.0 to 1.5 μm above gate 54. ILD layer 82 may be comprised of, for example, oxide, low-k materials, or oxide formed using tetraethyl orthosilicate (TEOS), and preferably oxide.

In an option, the stress layer is removed before the ILD layer 82 is formed (for example, see the SMT discussion above).

In FIG. 8, in an exemplary embodiment of the present invention, ILD layer 82 and stress layer 80 are patterned to form: (1) first opening 90 exposing at least a portion of substrate 50 within at least a portion of first junction region 56; (2) second opening 92 exposing at least a portion of gate 54; and (3) third opening 94 exposing a portion of substrate 50 within third junction region 58.

ILD layer 82 and stress layer 80 may be patterned by, for example, photomasking and reactive ion etch (RIE) processes. Respective contact structures 74, 76, 78 may then be formed within openings 90, 92, 94. Contact structures 74, 76, 78 may be comprised of, for example, W or TiN.

It is noted that optional openings/contacts can be formed over dummy gates 60, 62, but are not required.

The inventors have discovered that the use of overlying stress layer 80 and dummy gates 60, 62, the performance of LDMOS 66 is improved, that is, for example, the Ron is decreased, the gm is increased and the Idsat is increased.

Dummy gates 60, 62 can be made by any process and material and are not limited to the above example. The dummy gate structures 60, 62 separate the stress layer 80 from the substrate 50.

B. Examples

Numeral simulations using a 2D TCAD simulator with a calibrated stress engineering module have been performed by the inventors to demonstrate the effectiveness of this invention. The basic N-LDMOS device structure used for this simulation is shown in FIG. 4 and FIG. 8 (with two dummy gates).

Figure 9:
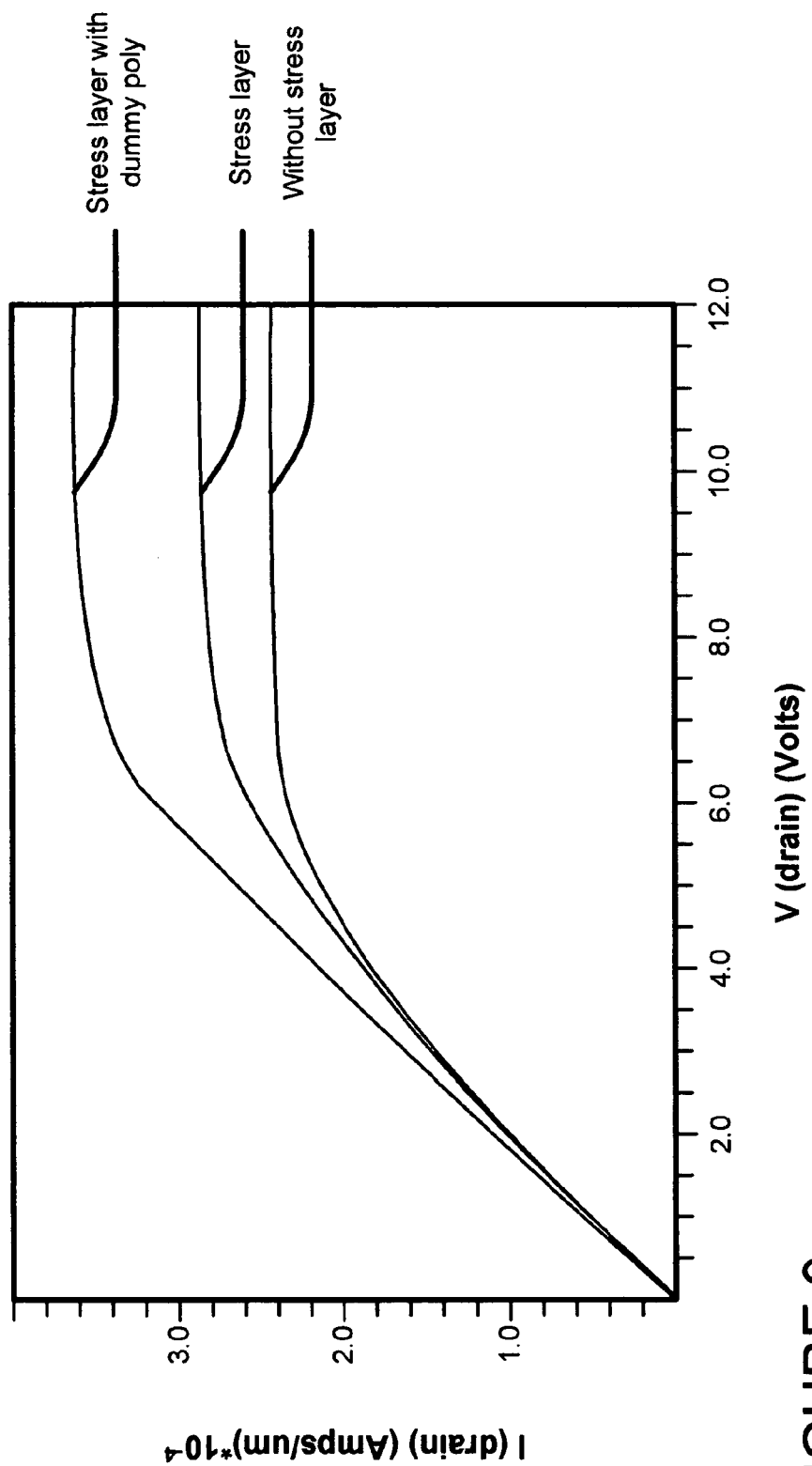
FIG. 9 is a graph illustrating selected improved characteristics of exemplary LDMOS embodiments of the present invention.

The simulation results with three cases (Si Control ("Without stress layer or dummy gates"), Stress layer and Stress layer with dummy poly (dummy gates) are depicted in Ids vs. Vds plots in FIG. 9, for example. As shown in FIG. 9, the Ids for the N-LDMOS in the saturation region are significantly enhanced with the stress layer 30 (the first embodiment—"Stress layer") and the Ids enhancement in the linear region (the linear region is the linear section of IdVd curve), which determines Ron and gm, are significantly large with the combination of stress layer 80 and dummy gates 60, 62 (second embodiment—"Stress layer with dummy poly"). These results are shown in Table 2 below.

Specifically, Table 2 below lists exemplary values for Ron, gm and Idsat for the use of a silicon control LDMOS as a base level (1×) (Si Control), the first embodiment of the present invention (Stress layer) and the second embodiment of the present invention ("Stress layer with dummy poly", i.e. stress layer with dummy gate(s)).

TABLE 2

|  | Ron | gm | Idsat |
| --- | --- | --- | --- |
| Si Control LDMOS | 1X | 1X | 1X |
| Stress layer(1$^{st}$ embodiment) | 0.93X | 1.50X | 1.17X |
| Stress layer & Dummy Gate(s) (2$^{nd}$ embodiment) | 0.80X | 1.60X | 1.50X |

As shown in Table 2, the first embodiment of the present invention has been shown to decrease the Ron by about 7%, increase the gm by about 50% and increase the Idsat by about 17% and the second embodiment of the present invention has been shown to decrease the Ron by about 20%, increase the gm by about 60% and increase the Idsat by about 50%.

C. Alternative Embodiments

The teachings of the present invention may be applied to various field effect transistors (FET) such as the exemplary high voltage FETs illustrated in FIGS. 11A through 11E.

FIGS. 11A through 11E. show FETs over which a stress layer (30) and optional dummy gate structure/structures (60/62) may be formed (with any dummy gate structures (60, 62) being formed over the offset drain/drain extension/deeply (double doped drain or deeply doped drain) doped drain (DDD) thereof. The Second junction region 20 can be a offset source or drain region.

FIG. 11F shows an example, where dummy gates and a stress layer are formed over the offset Source (e.g., DDD source or LLD Source) and DDD drain.

For example, FIG. 11A illustrates an exemplary RF LDMOS having an offset drain.

FIG. 11B illustrates an exemplary HV NFET having deeply doped sources/drains (DDD) adjacent the source and drain regions.

Figure 11C:
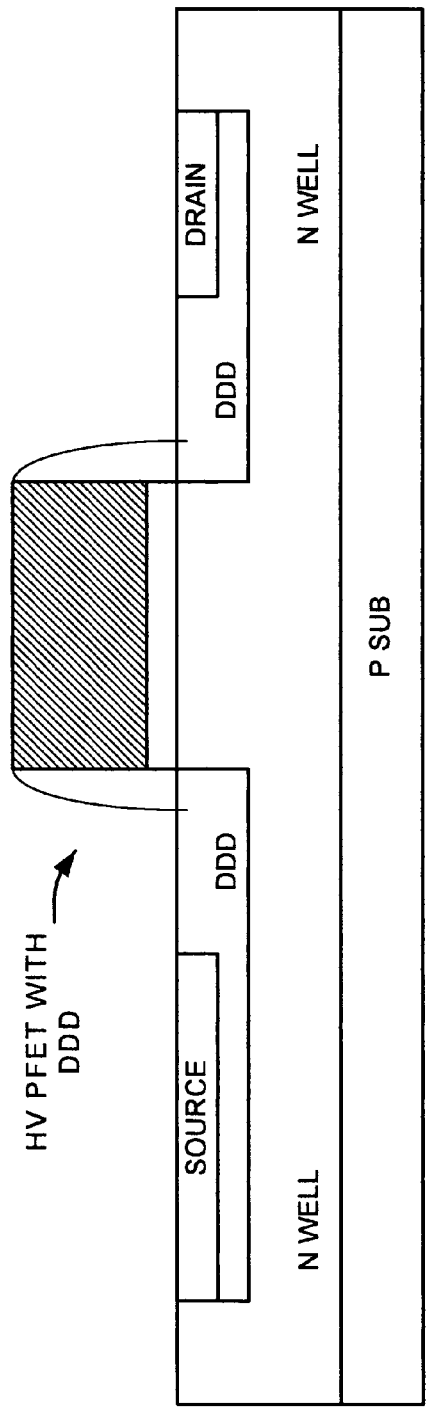

FIG. 11C illustrates an exemplary HV PFET having deeply doped drains (DDD) adjacent a source and drain.

Figure 11D:
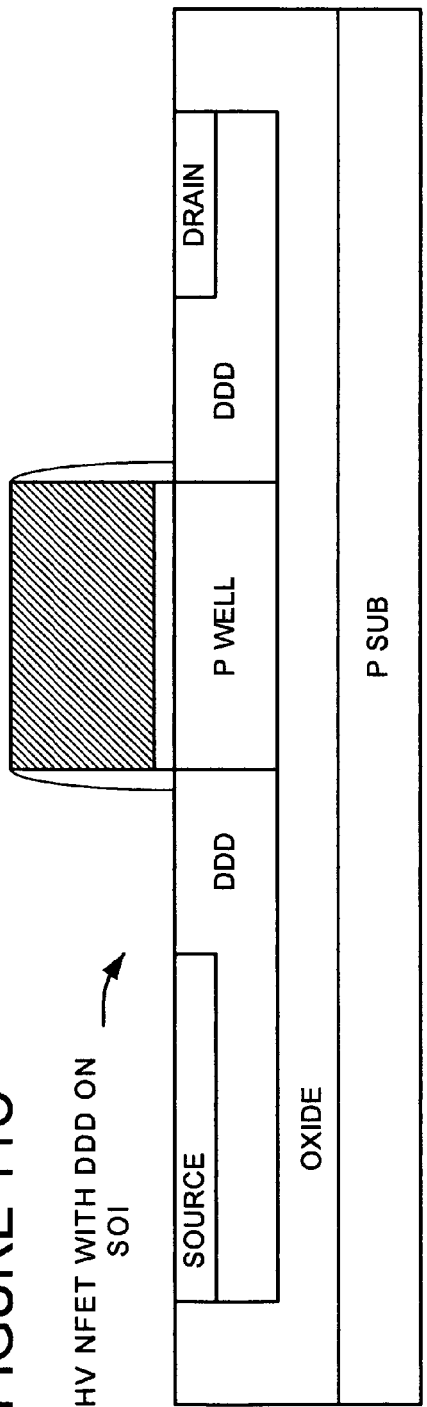

FIG. 11D illustrates an exemplary HV NFET with deeply doped drains (or (offset source and drains (LDD or DDD) adjacent a source and drain on silicon-on-oxide (SOI).

FIG. 11D illustrates an exemplary HV PFET with offset source and drains (e.g., deeply doped drains (DDD or LDD)) adjacent a source and drain on silicon-on-oxide (SOI).

The example embodiments can be used to make any type transistor that has an offset source or drain (e.g., an extended drain, deeply (doubly) doped drains (DDD), etc.) such as a LDMOS device or an HV FET device.

While a SiGe substrate is a high cost choice currently, the teachings/methods/structures of the present invention may be combined with such SiGe substrates (see above).

It is noted that in another aspect of invention, the instant invention also works/may be applicable to P LDMOS devices. For example, one may use a compressive stress layer in the P LDMOS. The tenants of the stress are applicable to both N and P type devices. The channel stress and the offset drain stress would be increased by using the stress layer on the transistor poly gate and dummy poly gate. The only difference would be to change the stress layer. As noted above, SMT can be used to keep the stress on N LDMOS and use compressive stress layer to improve the P LDMOS in the integration flow.

In yet another aspect, the dummy gate/stress layer embodiment may be used in conjunction with other NMOS devices such as, for example, a NMOS transistor or PMOS transistor.

As illustrated in FIG. 10A, in an exemplary embodiment of the invention, a tensile stress layer 30 (with an exaggerated thickness) having an internal compressive stress creates a tensile stress (shown as an arrow) in an underlying layer 10.

Figure 10B:
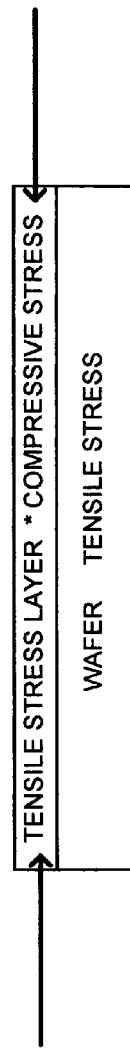
FIG. 10B is a schematic, global cross sectional view of a tensile stress layer overlying a wafer.
Figure 10C:
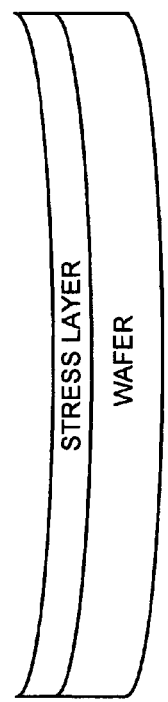
FIG. 10C is a schematic cross sectional view illustrating cross sectional view of a tensile stress layer over a LDMOS according to an exemplary embodiment of the present invention.

FIGS. 10B and 10C illustrate simplified, exaggerated, exemplary drawings showing a tensile stress layer having an internal compressive stress that creates a tensile stress in an underlying wafer urging the tensile stress layer/wafer to bow as illustrated in FIG. 10C.

D. Related Information

Lateral double diffused metal-oxide-semiconductors (LDMOS), and, for example, especially N-LDMOS devices, have been in a dominant position for enabling high voltage, high power radio frequency (RF) amplifiers for wireless phone base stations and phone handset applications, for example, due to its performance, cost, reliability and power advantages. The key to LDMOS/N-LDMOS device performance improvements are in the reduction of on-state resistance (Ron), the increase in transconductance (gm) and the increase of the breakdown voltage (Bvdss).

Conventional approaches for N-LDMOS device improvements, for example, have been centered on scaling down of both gate length (Lg) and offset drain or low doped drain (LDD) length and the LDD doping level. Improvements have been achieved by building an N-LDMOS device on a strained Si/relaxed $Si_xGe_{1-x}$ epitaxial (epi) layer through mobility enhancement in the channel and LDD region. However, the higher cost associated with strained Si/relaxed $Si_xGe_{1-x}$ epi substrates as N-LDMOS starting materials is a severe drawback for commercial production.

E. Non-Limiting Example Embodiments

Given the variety of exemplary embodiments of the present invention just described, the above description and illustrations show not be taken as limiting the scope of the present invention defined by the claims.

While the invention has been particularly shown and described with reference to the preferred exemplary embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A device comprising:
    a substrate;
    a gate on the substrate, the gate having first and second sides;
    a first junction region in the substrate adjacent to the gate on the first side;
    a second junction region in the substrate adjacent to the gate on the second side;
    at least one dummy gate on the substrate over the second junction region; and
    a stress layer over the substrate, the gate and the at least one dummy gate, the stress layer creates a stress in the channel and in the second junction region, wherein a placement of the dummy gate over the second junction region distributes the stress of the stress layer over the second junction region to increase the stress exerted across the second junction region as compared to that without the at least one dummy gate to improve performance of the device, wherein the substrate further comprising a fourth junction region adjacent to the gate on the first side, the fourth junction region separating the first junction region from the second junction region, wherein the fourth junction region comprises a depth deeper than the first and second junction regions, the fourth junction region encompassing the first junction region and only overlaps a portion of the second junction region and extends beyond the second side of the gate.

2. The device of claim 1 wherein:
    the first junction region comprises a first dopant concentration; and
    the second junction region comprises a second dopant concentration.

3. The device of claim 1 comprises a third junction region on the second side of the gate adjacent to the second junction region, wherein the at least one dummy gate distributes the stress of the stress layer over the second and third junction regions to increase the stress exerted across the second junction region as compared to that without the at least one dummy gate to improve performance of the device.

4. The device of claim 3 wherein:
    the first junction region comprises a first dopant concentration;
    the second junction region comprises a second dopant concentration; and
    the third junction region comprises a third dopant concentration, the third dopant concentrations greater than the second dopant concentration, wherein the third junction region is disposed within the second junction region.

5. The device of claim 3 wherein:
    the first junction region serves as a source of the device and is a heavily doped junction;
    the second junction region serves as on offset drain and is a lightly doped junction; and
    the third junction region serves as a drain and is a heavily doped junction; and
    a distance from the second side of the gate to the third junction serves as a drift region of the device.

6. The device of claim 5 wherein the fourth junction region comprises a doped well, wherein the doped well encompasses a portion of the second junction region including a channel below the gate without encompassing the entire second junction region, the doped well comprises dopants of the opposite polarity type as the first and second junction regions.

7. The device of claim 6 comprises a doped region adjacent to the first junction region away from the first side of the gate, wherein the doped region comprise dopants of the opposite polarity type as the first and second junction regions, the doped region serves as a contact region to the doped well.

8. The device of claim 7 wherein:
    a first terminal of the device is commonly coupled to the doped region and the first junction region;
    a second terminal of the device is coupled to the gate; and
    a third terminal of the device is coupled to the third junction region.

9. The device of claim 3 wherein:
    the substrate comprises a buried oxide layer between a surface and bulk substrate;
    the first junction region is disposed within the surface substrate and serves as a source of the device and is a heavily doped junction;
    the second junction region is disposed within the surface substrate and serves as on offset drain and is a lightly doped junction; and
    the third junction region is disposed within the surface substrate and serves as a drain and is a heavily doped junction.

10. The device of claim 9 wherein:
    the surface substrate comprises dopants of the opposite polarity type as the first, second and third junction regions, wherein the second and third junction regions are separated from the buried oxide layer by the substrate with the opposite polarity type dopants as the junction regions; and
    the fourth junction region comprises a doped well having dopants of the opposite polarity type as the first junction region, the doped well encompassing the first junction region and partially encompasses a portion under the gate.

11. The device of claim 3 wherein the fourth junction region separates the first junction region from the gate.

12. The device of claim 11 wherein:
    the first junction region serves as a source of the device and is a heavily doped junction region;
    the fourth junction region serves as an offset source region and is a lightly doped junction region;
    the second junction serves as an offset drain and is a lightly doped junction region; and
    the third junction region serves as a drain and is a heavily doped junction region.

13. The device of claim 12 wherein the fourth junction encompasses the first junction region and the second junction region encompasses the third junction region.

14. The device of claim 13 comprises at least one second dummy gate on the substrate over the fourth junction region to distribute the stress of the stress layer over the fourth and first junction regions to increase the stress exerted across the fourth junction region as compared to that without the at least one second dummy gate to improve performance of the device.

15. The device of claim 14 wherein the fourth junction region comprises a doped well which encompasses the first junction region and a channel below the gate, the doped well comprises dopants of the opposite polarity type as the first and second junction regions.

16. The device of claim 13 wherein:
- the substrate comprises a buried oxide layer between a surface and bulk substrate;
- a bottom of the second and fourth junction regions extend to a bottom of the surface substrate; and
- a portion of the surface substrate between the second and fourth junction regions comprises dopants of the opposite polarity type as the junction regions.

17. The device of claim 16 comprises at least one second dummy gate on the substrate over the fourth junction region to distribute the stress of the stress layer over the fourth and first junction regions to increase the stress exerted across the fourth junction region as compared to that without the at least one second dummy gate to improve performance of the device.

18. A device comprising:
- a substrate;
- a gate on the substrate, the gate having first and second sides;
- a first junction region in the substrate adjacent to the gate on the first side;
- a second junction region in the substrate adjacent to the gate on the second side;
- a third junction region on the second side of the gate adjacent to the second junction region;
- a plurality of dummy gates on the substrate over the second junction region; and
- a stress layer over the substrate, the gate and the plurality of dummy gates, the stress layer creates a stress in the channel and in the second junction region, wherein the dummy gates distribute the stress of the stress layer over the second junction region to increase the stress exerted across the second junction region as compared to that without the dummy gates to improve performance of the device,
- wherein the substrate further comprising a fourth junction region adjacent to the gate on the first side, the fourth junction region separating the first junction region from the second junction region, wherein the fourth junction region comprises a depth deeper than the first and second junction regions, the fourth junction region encompassing the first junction region and only overlaps a portion of the second junction region and extends beyond the second side of the gate.

19. The device of claim 18 further comprising a third junction region on the second side of the gate adjacent to the second junction region.

20. A transistor comprising:
- a substrate;
- a gate on the substrate, the gate having first and second sides;
- a first junction region in the substrate adjacent to the gate on the first side;
- a second junction region in the substrate adjacent to the gate on the second side;
- a third junction region on the second side of the gate adjacent to the second junction region;
- a fourth junction region adjacent to the gate on the first side, the fourth junction region separating the first junction region from the second junction region, wherein the fourth junction region comprises a depth deeper than the first and second junction regions, the fourth junction region encompassing the first junction region and overlaps a portion of the second junction region without encompassing the second junction;
- at least one first dummy gate on the substrate over the second junction region;
- at least one second dummy gate on the substrate over the fourth junction region; and
- a stress layer over the substrate, the gate and the at least one first and second dummy gates, the stress layer creates a stress in the channel and in the second and fourth junction regions, wherein the dummy gate distributes the stress of the stress layer over the second and third junction regions and the fourth and first junction regions to increase the stress exerted across the second junction region and fourth junction region as compared to that without the at least one first and second dummy gates to improve performance of the device.

* * * * *